United States Patent [19]

Ohno

[11] Patent Number: 4,676,614

[45] Date of Patent: Jun. 30, 1987

[54] APPARATUS FOR REGULATING THE OPTICAL CHARACTERISTICS OF A PROJECTION OPTICAL SYSTEM

[75] Inventor: Koichi Ohno, Inagi, Japan

[73] Assignee: Nippon Kogaku K. K., Tokyo, Japan

[21] Appl. No.: 744,175

[22] Filed: Jun. 13, 1985

[30] Foreign Application Priority Data

Jun. 25, 1984 [JP] Japan ................... 59-130416

[51] Int. Cl.⁴ .................................. G03B 3/10
[52] U.S. Cl. ......................... 353/101; 353/69; 350/419
[58] Field of Search ............. 353/101, 69, 122; 355/52-53, 30, 63; 350/418, 419, 242, 253

[56] References Cited

U.S. PATENT DOCUMENTS

| | | | |
|---|---|---|---|
| 2,836,101 | 5/1958 | De Swart | 350/419 |
| 3,788,730 | 1/1974 | Greenleaf | 350/418 |
| 3,891,314 | 6/1975 | Lakin et al. | 353/101 |
| 4,331,388 | 5/1982 | McCrobie et al. | 350/419 |
| 4,362,385 | 12/1982 | Lobach | 355/53 |
| 4,383,757 | 5/1983 | Phillips | 355/53 |
| 4,420,233 | 12/1983 | Nomoto et al. | 353/101 |
| 4,538,914 | 9/1985 | Yomoda et al. | 355/53 |

FOREIGN PATENT DOCUMENTS

0052009 4/1980 Japan .................... 350/419

*Primary Examiner*—Charles Frankfort
*Assistant Examiner*—Patrick R. Scanlon
*Attorney, Agent, or Firm*—Shapiro and Shapiro

[57] ABSTRACT

An optical apparatus for projecting a pattern on a first plane onto a second plane comprises a projection optical system disposed between the first plane and the second plane to form an imaging optical path, a structure for forming a space independent from the ambient space and filled with a gas between the first plane and the second plane in such a manner that the imaging optical path passes therethrough, the structure including a first transparent flat member perpendicular to the optic axis of the projection optical system and forming the entrance surface of the imaging light beam to the independent space and a second transparent flat member parallel to the first transparent flat member and forming the exit surface of the imaging light beam from the independent space, the gas filling the independent space having a refractive index different from the refractive index of the ambient space, and a device for regulating the distance between the first transparent flat member and the second transparent flat member and varying the thickness of the independent space in the direction of the optic axis.

18 Claims, 3 Drawing Figures

APPARATUS FOR REGULATING THE OPTICAL CHARACTERISTICS OF A PROJECTION OPTICAL SYSTEM

BACKGROUND OF THE INVENTION

1. Field of the Invention

This invention relates to an apparatus for regulating the optical characteristics of a projection optical apparatus, and in particular to an apparatus for highly accurately regulating the optical characteristics of a projection exposure apparatus used to project a minute pattern depicted on a photomask or a reticle onto a semiconductive wafer.

2. Description of the Prior Art

In recent years, semiconductor devices such as IC and LSI have been steadily in the tendency toward higher integration (higher density) and minuteness, and exacting accuracy has been required of lithography apparatuses for manufacturing these. Particularly, in an apparatus for reduction-projecting a circuit pattern depicted on a photomask or a reticle onto a semiconductive wafer through a projection optical system, severe manufacturing conditions are required in order to satisfy the predetermined optical characteristics such as the magnification and focal length of the projection optical system. Nevertheless, it is difficult to obtain a projection optical system which is stable for a long period of time, and for example, fluctuation of the atmospheric pressure in the environment wherein the exposure apparatus is installed, thermal fluctuation by the illuminating light of high energy passing through the projection optical system, etc. are complicatedly intertwined to cause a fluctuation of the magnification and a fluctuation of the focus.

Particularly, when a fluctuation of the magnification is caused, the superposition accuracy of the image of a circuit pattern projected onto the wafer and the chip already formed on the wafer is substantially degraded, and this not only reduces the yield of semiconductor element manufacture, but also, in the worst case, gives rise to a serious disadvantage that superposition exposure becomes impossible. Even if a projection optical system having a resolving power of submicrons could be manufactured, it cannot be said to be satisfactory as an apparatus for effecting superposition exposure at the IC production field unless the fluctuation of the magnification, the fluctuation of the focus, etc. are sufficiently small in conformity with the resolving power. This unavoidably leads to the necessity of designing LSI by setting the minimum limit of the line width of the pattern to a value considerably greater than the line width conforming to the original resolving power obtained by the projection optical system with the fluctuation of the magnification and the fluctuation of the focus being taken into account, and may be a cause which will hinder the tendency toward higher density and minuteness.

SUMMARY OF THE INVENTION

It is an object of the present invention to overcome the above-noted disadvantages and to provide a projection optical apparatus which can keep the projection magnification and the resolving power highly accurately irrespective of any fluctuation of the optical characteristics occurring to the projection optical system.

It is another object of the present invention to provide a regulating apparatus which can highly accurately vary the projection magnification by a very minute amount.

It is still another object of the present invention to provide a projection optical system provided with an apparatus for correcting the optical characteristics varied in conformity with the fluctuation of the atmospheric pressure and the amount of incident energy.

The regulating apparatus of the present invention includes two parallel transparent flat members disposed perpendicularly to the optic axis of the projection optical system in the optical path between a photomask or a reticle disposed on the object plane of the projection optical system and a semiconductive wafer disposed on the imaging plane. A gas having a refractive index different from that of the atmosphere is hermetically sealed in the gap between the two flat members. The spacing between the two flat members is regulated to regulate the optical characteristics such as the magnification and the imaging position of the projection optical system.

Each of the two flat members is formed by a plate, a sheet, a film, etc. By using pellicles of high molecular weight material as the flat members, the influence of the flat members themselves on the magnification can be made negligibly small. In order to maintain the planarity of the flat members, it is necessary that the pressure of the hermetically sealed gas be kept equal to the atmospheric pressure.

The above-described regulating apparatus can regulate the magnification by being disposed in the optical path of a non-telecentric optical system, but if it is directed to only the regulation of the position of the imaging plane, it may be disposed in the optical path of a telecentric optical system.

DESCRIPTION OF THE PREFERRED EMBODIMENTS

Figure 1:
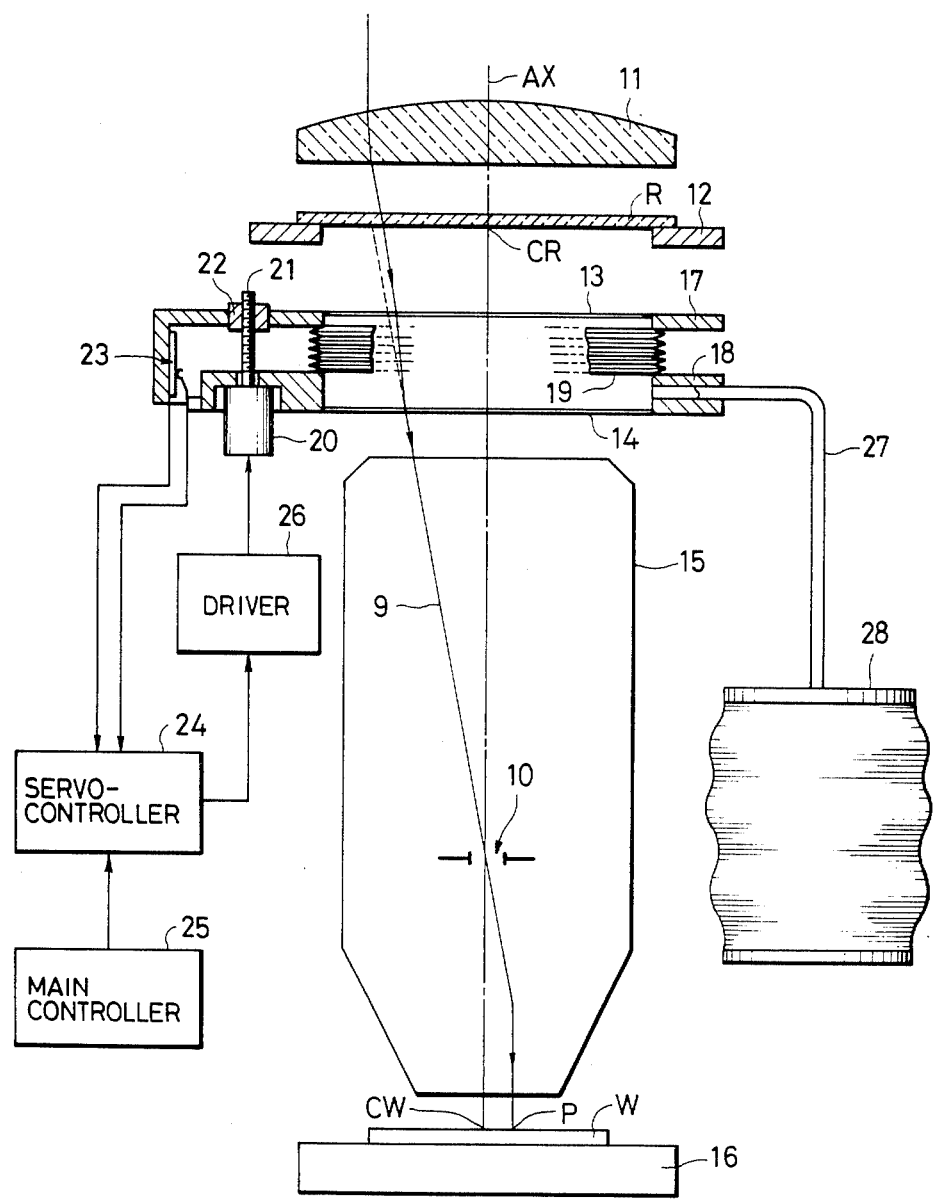
FIG. 1 schematically shows the construction of a projection optical apparatus according to an embodiment of the present invention.

FIG. 1 schematically shows the construction of a projection optical apparatus according to an embodiment of the present invention. An illuminating light emitted from a light source, not shown, and uniformized through a condenser lens 11 forming a part of an illuminating optical system illuminates a reticle R held on a holder 12. The optical image of an original pattern depicted on the underside of the reticle R passes through a pair of parallel transparent pellicles 13 and 14 disposed in the atmosphere perpendicularly to the optic axis, is reduced to a predetermined magnification, e.g., 1/5, by a reduction projection lens 15 containing an unshown lens system therein, and is imaged on a semiconductive wafer W placed on a stage 16. The projection lens 15 in the present embodiment is an optical system non-telecentric on the object side (the reticle R side) and telecentric on the image side. The reticle R and the wafer W are both disposed perpendicularly to the optic axis AX of the projection lens 15. The upper pellicle 13 is provided in a holding frame 17 disposed so as not to intercept the projection optical path, and the lower pellicle 14 is provided in a similar holding frame 18. The holding frames 17 and 18 are coupled together by retractile bellows 19, and the space defined between the two pellicles is an air-tight space isolated from the atmosphere. A motor 20 is fixed to the holding frame 18, and a feed screw 21 rotated in operative association with the rotary shaft of the motor 20 is threadably engaged with a nut 22 fixed to the holding frame 17. Therefore, the relative spacing between the holding frames 17 and 18, i.e., the spacing between the pellicles 13 and 14, is varied in the direction of the optic axis by the revolution of the motor 20. A linear potentiometer 23 puts out to a servo-control circuit 24 a detection signal corresponding to the spacing between the two pellicles. The servo-control circuit 24 puts out to a drive circuit 26 a drive signal corresponding to the difference between the command signal from a main controller 25 and the detection signal. Thereby the motor 20 is servo-controlled so that the spacing between the two pellicles always corresponds to the command signal. The main controller 25 generally controls the operation sequence of the entire exposure apparatus, and introduces thereinto information such as the variation in the total energy of the illuminating light entering the projection lens and the variation in the atmospheric pressure and determines the thickness of an air-tight space necessary to correct the variation in the magnification of the projection lens itself. The air-tight space defined between the pellicles 13 and 14 is in communication with an outside gas reservoir 8 through a pipe 27. The gas reservoir 28 is a vessel of thin film and has a sufficiently large volume relative to the air-tight space, and freely varies its volume so that the pressure therein is always equal to the atmospheric pressure, thereby ensuring the pressure in the air-tight space to be equal to the atmospheric pressure. A gas containing components different from the gas components of the atmosphere, for example, a gas such as hydrogen, carbon dioxide, helium, benzene, nitrogen or freon, is enclosed in the air-tight space and the gas reservoir 28. Since the refractive indices of these gases differ from the refractive index of the atmosphere (air), a parallel plane structure is formed by the air-tight space defined between the two parallel pellicles 13 and 14.

Figure 2:
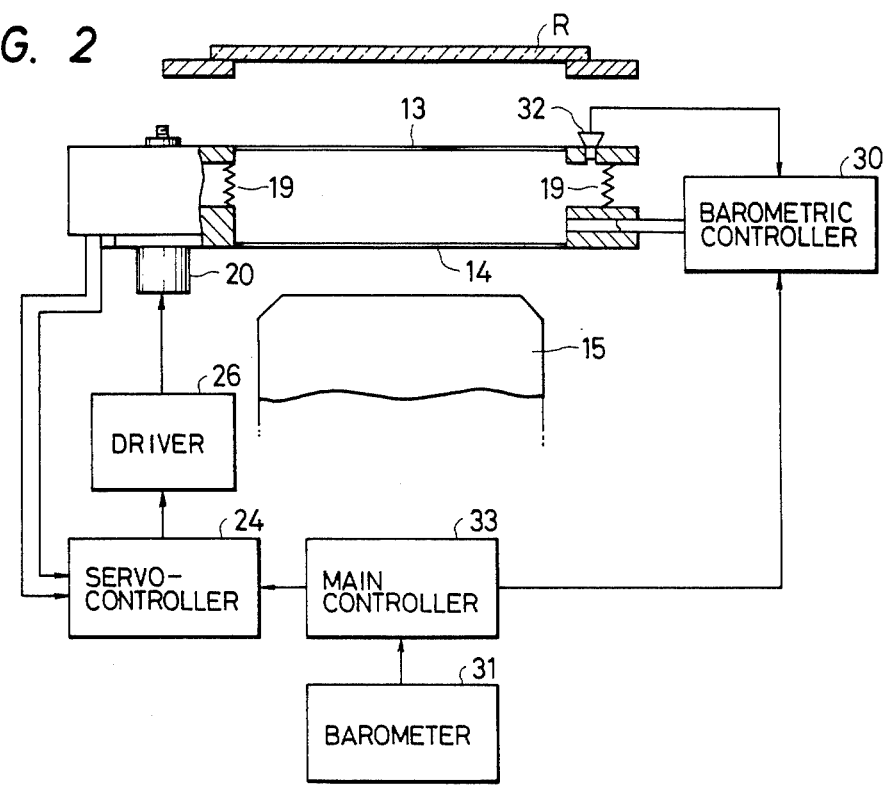
FIG. 2 schematically shows the construction of an apparatus according to another embodiment of the present invention.

Instead of using the gas reservoir, the construction as shown in FIG. 2 may be effectively adopted. The gas filling the space between the pellicles 13 and 14 has its pressure strictly controlled by a barometric controller 30. Here are provided a barometer 31 for measuring the atmospheric pressure and a pressure gauge 32 for detecting the pressure in the air-tight space, and a main controller 33 controls the barometric controller 30 on the basis of the information from the barometer 31. The barometric controller 30 continues the supply or the collection of the gas to or from the air-tight space so that the pressure in the air-tight space is always equal to the atmospheric pressure while comparing the information from the pressure gauge 32 with the atmospheric pressure information.

In such a construction, when the point of intersection with the optic axis AX on the reticle R is the center CR and the point of intersection on the wafer W corresponding thereto is the center CW, the position on the reticle R corresponding to the image point P on the wafer W spaced apart by a predetermined distance from the center CW shifts toward the optic axis due to the refraction of a principal light ray 9 passing through the center of the entrance pupil 10 of the projection lens during the entry thereof into the air-tight space and during the emergence thereof from the air-tight space. The amount of such shift is in accord with the thickness of the air-tight space, i.e., the spacing between the two pellicles 13 and 14. In other words, the projection magnification can be varied in accordance with the thickness t of the air-tight space.

Figure 3:
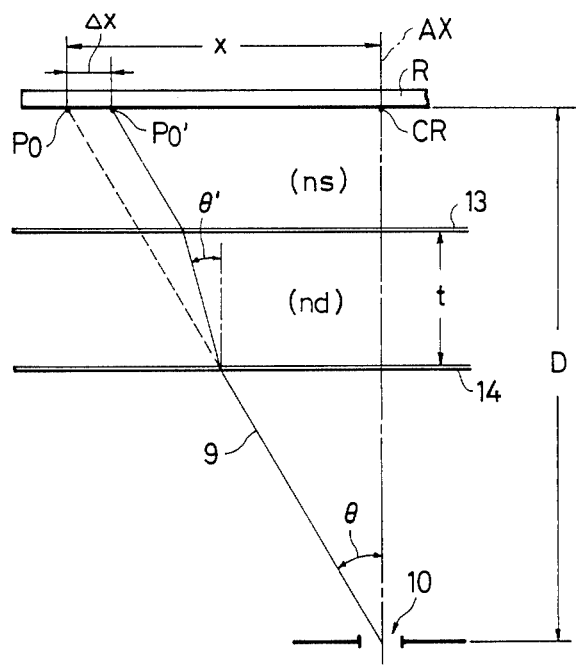
FIG. 3 shows the optical path of a principal light ray passing through the regulating apparatus and the entrance pupil.

The relation between the thickness t of the air-tight space and the projection magnification is primarily determined as shown in FIG. 3. The position on the reticle R corresponding to the image point P on the wafer W spaced apart by a predetermined distance from the center CW is the object point Po when the plain parallel is absent. Therefore, the angle $\theta$ formed between the principal light ray 9 and the optic axis AX is expressed as $$\theta = \tan^{-1}(x/D) \ldots \quad (1)$$

where x is the distance between the center CR of the reticle and the object point Po and D is the distance from the underside of the reticle to the entrance pupil 10. Also, when the refractive index of the atmosphere is ns and the refractive index of the gas in the airtight space is nd, the angle of refraction $\theta'$ of the principal light ray 9 in the air-tight space is expressed as follows from the law of $ns \cdot \sin\theta = nd \cdot \sin\theta'$:

$$\theta' = \sin^{-1}\left(\frac{ns}{nd} \cdot \sin\theta\right) \quad (2)$$

Accordingly, the distance $\Delta x$ between the object point Po and the object point Po' created by the interposition of the air-tight space having the thickness t is expressed as $$\Delta x = t \cdot \sin(\theta - \theta')/(\cos\theta \cdot \cos\theta') \quad (3)$$
$$= t \cdot (\tan\theta - \tan\theta').$$

If equations (1) and (2) are substituted into this equation (3), $$\Delta x = t \cdot \left[ x/D - \tan\left\{ \sin^{-1}\left(\frac{ns}{nd} \cdot \sin\theta\right)\right\}\right], \quad (4)$$

and if the distances x and D and the refractive indices ns and nd are of constant values, the distance $\Delta x$ becomes a linear function having the thickness t as a variable. Where, as an example, the distance x is 37 mm and the distance D is 350 mm and the refractive index ns of the air in the wavelength 440 nm of the illuminating light is 1.0002809 and benzene having the refractive index nd of 1.001762 is used as the gas, $\Delta x$ is given as follows by equation (4):

$$\Delta x = 0.158 t \ldots (5)$$

In this equation (5), the unit of the thickness t is mm and the unit of $\Delta x$ is $\mu$m. Accordingly, when t=50 mm, $\Delta x = 7.9 \, \mu$m.

On the other hand, when the reduction magnification of the projection lens is M (M≦1), if the condition from which equation (5) was derived is intactly used, the amount of movement $\Delta W$ of the image point on the wafer W is $$\Delta W = M \cdot \Delta x = 0.158 \, M \cdot t \ldots \quad (6).$$

Accordingly, when the air-tight space is absent, the image point P of the object point Po at the distance x from the center CR of the reticle R is projected at the distance M.x from the center CW of the wafer W, but by interposing the air-tight space having the thickness t, the image point P is projected at a position deviated by $\Delta W$ determined by equation (6). That is, the size of the projected image of the original pattern can be enlarged or reduced by a minute amount in accordance with the thickness t.

Some specific examples of the adjustment according to the apparatus of the present embodiment will hereinafter be described. Assuming that the size of the original pattern of the reticle R is 74 mm × 74 mm (a pattern in which the distance x is 37 mm at greatest), that the projection magnification M during the initial setting when there is no fluctuation of the incident energy and the atmospheric pressure is 1/5 and that the then thickness t is 50 mm, the original pattern is originally projected onto the wafer W with a size of 14.8 mm × 14.8 mm. Let it also be assumed that the projection magnification error on the wafer W is detected as 0.5 μm by the main controller 25. In this case, from equation (6), the main controller 25 determines the amount dt to be varied from the initial thickness t as $$dt = \Delta W / 0.158 \cdot M = 0.5 / 0.158 \cdot (1/5) \approx 15.8 \text{ mm}.$$

That is, if the spacing between the pellicles 13 and 14 is varied by 15.8 mm from the initial thickness t (50 mm), the fluctuation of the projection magnification is corrected. Thus, the main controller 25 puts out to the servo-control circuit 24 a command value corresponding to t+dt=65.8 mm. The servo-control circuit 24 puts out to the drive circuit 26 a driving signal corresponding to the difference between the detection value from the linear potentiometer 23 and the command value and drives the motor 20. For the variation in the volume of the air-tight space occurring during this time, the gas reservoir 28 varies the volume thereof so as to keep the pressure in the air-tight space equal to the atmospheric pressure, thereby keeping the two pellicles in poarallel planes. It is desirable that the expansion and contraction of the gas reservoir 28 be forcibly effected by a motor or the like in proportion to the amount of variation in the thickness t, in response to the driving signal from the servo-control circuit 24. Further, it is preferable that even when the thickness t is not varied, the gas reservoir 28 be controlled in expansion and contraction so as to be equal in pressure, in response to the detection signal from a differential pressure sensor, not shown, for detecting the difference between the atmospheric pressure and the pressure in the air-tight space.

As another specific example, where carbon dioxide ($CO_2$) having the refractive index nd of 1.000448 is used, equations (5) and (6) become the following equations (7) and (8), respectively:

$$\Delta x = 0.018 \, t \ldots \quad (7)$$

$$\Delta W = 0.018 \, M \cdot t \ldots \quad (8)$$

Assuming that the projection magnification error on the wafer W is detected as 0.1 μm, in the case of $CO_2$ gas, the amount dt to be varied is operated as follows from equation (7):

$$dt = \Delta W / 0.018 \cdot M = 0.1 / 0.018 (1/5) \approx 27.8 \text{ mm}.$$

In the above-described embodiment, where two glass plates are used as the flat member, it is necessary to design the magnification of the projection lens itself with the thicknesses and refractive indices of the two glass plates taken into account.

The projection optical system of the present invention may be constituted not only by a refracting system using a projection lens, but also by a reflecting system.

I claim:

1. An optical apparatus for projecting a pattern formed on a first plane onto a second plane, comprising:
   (a) a projection optical system having an optical axis and disposed between said first plane and said second plane to form an imaging optical path;
   (b) means for forming a space between said first plane and said second plane that is independent from an ambient space, that is filled with a gas, and that is disposed so that said imaging optical path passes therethrough, said means including a first transparent flat member perpendicular to the optical axis of said projection optical system and a second transparent flat member parallel to said first transparent flat member, said independent space being formed between said first and second transparent flat members;
   (c) said ambient space and said gas filling said independent space having different refractive indexes;
   (d) means for detecting an atmospheric pressure of said ambient space;
   (e) means for regulating the distance between said first transparent flat member and said second transparent flat member to vary the thickness of said independent space in the direction of said optical axis as a function of said atmospheric pressure detected by said detecting means to thereby regulate an optical characteristic of said optical apparatus.

2. An optical apparatus according to claim 1, further comprising means for controlling the pressure of said gas in said independent space, and wherein said controlling means keeps the pressure of said gas in said independent space equal to said atmospheric pressure of said ambient space in response to said detecting means.

3. An optical apparatus according to claim 1, wherein said flat members are made of glass.

4. An optical apparatus for projecting a pattern formed on a first plane onto a second plane, comprising:
   (a) a projection optical system having an optical axis and disposed between said first plane and said second plane to form an imaging optical path;
   (b) means for forming a space between said first plane and said second plane that is independent from an ambient space, that is filled with a gas, and that is disposed so that said imaging optical path passes therethrough, said means including a first transparent flat member perpendicular to the optical axis of said projection optical system and a second transparent flat member parallel to said first transparent flat member, said independent space being formed between said first and second transparent flat members;

(c) said ambient space and said gas filling said independent space having different refractive indexes;

(d) means for regulating the distance between said first transparent flat member and said second transparent flat member to vary the thickness of said independent space in the direction of said optical axis; and (e) control means for keeping the pressure of said gas in said independent space equal to an atmospheric pressure of said ambient space, said control means including gas reservoir means coupled to said independent space and filled with said gas, the volume of said gas reservoir means being variable to keep the pressure therein equal to the atmospheric pressure of said ambient space.

5. An optical apparatus according to claim 4, wherein said gas reservoir means has a peripheral wall formed of a flexible film.

6. An optical apparatus according to claim 4, wherein said means for forming said independent space is disposed between said first plane and said projection optical system.

7. An optical apparatus according to claim 4, wherein said means for forming said independent space further includes first and second frame members for supporting said first and second transparent flat members, respectively, and said regulating means includes drive means for imparting relative displacement to and between said first and second frame members in the direction of said optical axis.

8. An optical apparatus according to claim 7, wherein said drive means includes means for setting the thickness of said independent space and determining the amount of said relative displacement of said first and second frame members.

9. An optical apparatus according to claim 4, wherein said means for forming said independent space further includes a first frame member having an inner peripheral edge in intimate contact with the circumference of said first transparent flat member, a second frame member having an inner peripheral edge in intimate contact with the circumference of said second transparent flat member, and an annular flexible member provided to fill up the gap between said first and second frame members.

10. An optical apparatus according to claim 4, wherein each of said first and second transparent flat members is a thin film formed of a high molecular weight material.

11. An optical apparatus according to claim 4, wherein said ambient space is occupied by a gas different from the gas filling said independent space.

12. An optical apparatus for projecting a pattern formed on a first plane onto a second plane, comprising:
(a) a projection optical system having an optical axis and disposed between said first plane and said second plane to form an imaging optical path;
(b) means for forming a space between said first plane and said second plane that is independent from an ambient space, that is filled with a gas, and that is disposed so that said imaging optical path passes therethrough, said means including a first transparent flat member perpendicular to the optical axis of said projection optical system and a second transparent flat member parallel to said first transparent flat member, said independent space being formed between said first and second transpprent flat members;

(c) said ambient space and said gas filling said independent space having different refractive indexes;

(d) means for regulating the distance between said first transparent flat member and said second transparent flat member to vary the thickness of said independent space in the direction of said optical axis; and (e) control means for keeping the pressure of said gas in said independent space equal to an atmospheric pressure of said ambient space, said control means including means for measuring the atmospheric pressure of said ambient space and putting out first information indicating said atmospheric pressure, means for measuring the pressure of said gas in said independent space and putting out second information indicating said pressure of said gas, and means responsive to said first information and said second information to adjust the quantity of said gas in said independent space.

13. An optical apparatus according to claim 12, wherein said means for forming said independent space is disposed between said first plane and said projection optical system.

14. An optical apparatus according to claim 12, wherein said means for forming said independent space further includes first and second frame members for supporting said first and second transparent flat members, respectively, and said regulating means includes drive means for imparting relative displacement to and between said first and second frame members in the direction of said optical axis.

15. An optical apparatus according to claim 14, wherein said drive means includes means for setting the thickness of said independent space and determining the amount of said relative displacement of said first and second frame members.

16. An optical apparatus according to claim 12, wherein said means for forming said independent space further includes a first frame member having an inner peripheral edge in intimate contact with the circumference of said first transparent flat member, a second frame member having an inner peripheral edge in intimate contact with the circumference of said second transparent flat member, and an annular flexible member provided to fill up the gap between said first and second frame members.

17. An optical apparatus according to claim 12, wherein each of said first and second transparent flat members is a thin film formed of a high molecular weight material.

18. An optical apparatus according to claim 12, wherein said ambient space is occupied by a gas different from the gas filling said independent space.

* * * * *